US011735870B2

(12) United States Patent
Huang et al.

(10) Patent No.: US 11,735,870 B2
(45) Date of Patent: Aug. 22, 2023

(54) METHOD FOR IDENTIFYING SIGNAL TRANSMISSION DEVICE AND SIGNAL PROCESSING SYSTEM UTILIZING THE SAME

(71) Applicant: Realtek Semiconductor Corp., HsinChu (TW)

(72) Inventors: Yueh-Hsing Huang, HsinChu (TW); Sen-Huang Tang, HsinChu (TW); Wu-Chih Lin, HsinChu (TW); Cheng-Kai Lai, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 273 days.

(21) Appl. No.: 17/322,928

(22) Filed: May 18, 2021

(65) Prior Publication Data

US 2022/0149572 A1    May 12, 2022

(30) Foreign Application Priority Data

Nov. 9, 2020   (TW) .................................. 109139011

(51) Int. Cl.
  *H01R 13/66*  (2006.01)
  *G01R 31/08*  (2020.01)
  *H01R 31/06*  (2006.01)

(52) U.S. Cl.
  CPC ....... *H01R 13/6691* (2013.01); *G01R 31/081* (2013.01); *H01R 31/06* (2013.01)

(58) Field of Classification Search
  CPC ... H01R 13/6691; H01R 31/06; G01R 31/081
  See application file for complete search history.

(56) References Cited

U.S. PATENT DOCUMENTS

| 7,049,937 | B1 * | 5/2006 | Zweig .................. H01R 13/641 340/657 |
| 7,193,422 | B2 * | 3/2007 | Velleca .............. H01R 13/6691 702/183 |
| 7,377,805 | B2 * | 5/2008 | Kim ........................ H01R 24/28 439/502 |
| 7,544,909 | B2 * | 6/2009 | Dhir ..................... H01R 13/641 200/51.11 |
| 8,095,713 | B2 * | 1/2012 | Minoo ................... H01R 29/00 710/104 |
| 8,704,673 | B2 * | 4/2014 | Chang .................. H02J 7/0049 340/636.2 |

(Continued)

FOREIGN PATENT DOCUMENTS

TW          I703871 B      9/2020

*Primary Examiner* — Thanh Tam T Le
(74) *Attorney, Agent, or Firm* — Winston Hsu (57) ABSTRACT

A method for identifying a signal transmission device includes: reading attribute information from a memory device by a first device of a signal processing system, wherein the attribute information records information regarding at least one attribute of the signal transmission device that is coupled between the first device and a second device of the signal processing system; determining the at least one attribute of the signal transmission device by the first device according to the attribute information; and setting a maximum value or a minimum value of a signal output by the first device or the second device according to the at least one attribute.

15 Claims, 4 Drawing Sheets

(56) References Cited

U.S. PATENT DOCUMENTS

| | | | |
|---|---|---|---|
| 10,027,080 B2 * | 7/2018 | Solland | H01R 29/00 |
| 10,247,893 B1 * | 4/2019 | Elkayam | H02J 1/10 |
| 10,483,018 B1 * | 11/2019 | Chiu | G01R 27/26 |
| 11,116,073 B2 * | 9/2021 | Yokota | H01R 13/6461 |
| 11,309,665 B1 * | 4/2022 | Jukic | G06F 15/16 |
| 11,502,467 B2 * | 11/2022 | Deng | H01R 13/6205 |
| 2008/0057767 A1 * | 3/2008 | O'Rourke | H01R 13/6691 |
| | | | 439/345 |

* cited by examiner

METHOD FOR IDENTIFYING SIGNAL TRANSMISSION DEVICE AND SIGNAL PROCESSING SYSTEM UTILIZING THE SAME

BACKGROUND OF THE INVENTION

1. Field of the Invention

The invention relates to a method for identifying a signal transmission device and a signal processing system implementing the method, for obtaining attribute information of the signal transmission device and thereby controlling operations of the signal processing system according to the attribute information of the signal transmission device.

2. Description of the Prior Art

The specifications of current signal transmission device products, such as cables, transmission lines . . . etc., are usually marked in the label or specified in the manual, and users can purchase the products they need according to the specifications. Once the label is removed, or the manual is unavailable, the users are unable to access the specification information. If a user connects the purchased signal transmission device to a device mismatched to its specifications, for example, if the output current of the device is higher than an upper limit of the withstand current of the signal transmission device, the signal transmission device may overheat or be damaged.

Therefore, there is a need for a signal processing system with the capability of identifying a signal transmission device and a corresponding method for identifying a signal transmission device, for obtaining attribute information of the signal transmission device and controlling the operations of the signal processing system based on the result of device identification, so that the signal transmission device can be properly used in the signal processing system.

SUMMARY OF THE INVENTION

It is an objective of the invention to solve the problems of overheating or damaging a device due to the operation of connecting a wrong device or a device that fails to match the specifications to the system.

According to an embodiment of the invention, a method for identifying a signal transmission device includes: reading attribute information from a memory device by a first device of a signal processing system, wherein the attribute information records information regarding at least one attribute of the signal transmission device that is coupled between the first device and a second device of the signal processing system; determining the at least one attribute of the signal transmission device by the first device according to the attribute information; and setting a maximum value or a minimum value of a signal output by the first device or the second device according to the at least one attribute.

According to another embodiment of the invention, a signal processing system comprises a first device arranged to output a signal, a second device arranged to receive the signal and a signal transmission device coupled between the first device and the second device for exchange of the signal. The signal transmission device comprises a memory device. The memory device stores attribute information and the attribute information records information regarding at least one attribute of the signal transmission device. One of the first device and the second device is arranged to read the attribute information from the memory device, determine the at least one attribute of the signal transmission device according to the attribute information and set a maximum value or a minimum value of the signal output by the first device or another signal output by the second device according to the at least one attribute.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
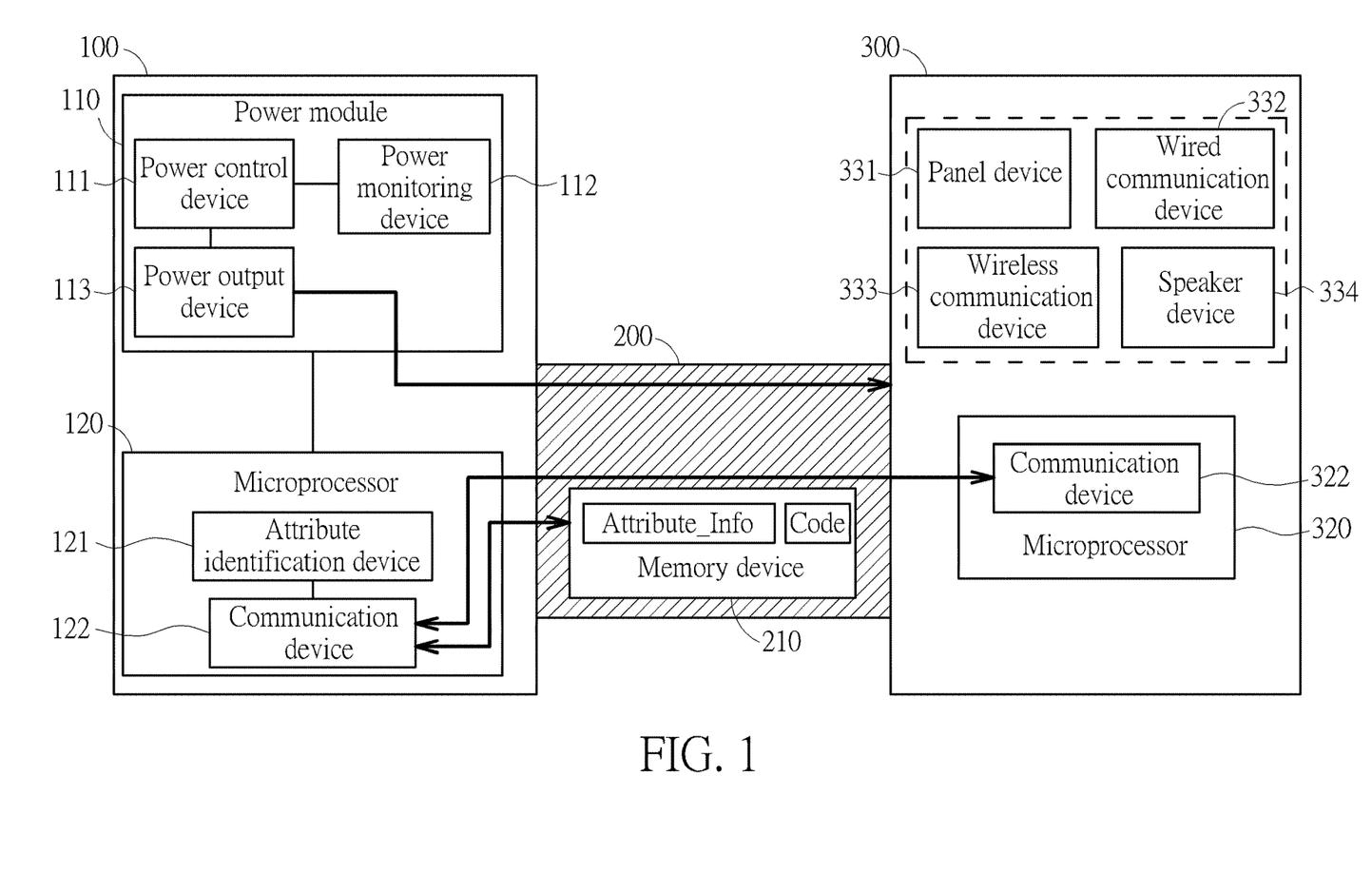
FIG. 1 shows a block diagram of a signal processing system according to an embodiment of the invention.

FIG. 1 shows a block diagram of a signal processing system according to an embodiment of the invention. The signal processing system may comprise a first device 100, a signal transmission device 200, and a second device 300. In an embodiment of the invention, the first device 100 may be used as a signal source and arranged to output at least one signal (e.g., a video signal, an audio signal, etc.), and the second device 300 may receive signal provided by the first device 100 through the signal transmission device 200. According to an embodiment of the invention, the first device 100 may be a media player, and the player may be implemented by, for example, but not limited to, a mobile device such as a mobile phone or a tablet, a computing device such as a laptop or a desktop computer, a set-top box (STB), a compact disc (CD)/Digital Versatile Disc (DVD) player or other electronic products. The second device 300 may be a display device, and the display device may be implemented by, for example, but not limited to, a display panel, a screen, or an electronic product such as a digital TV.

The signal transmission device 200 may be a pluggable or removable physical device coupled between the first device 100 and the second device 300 and utilized for transmitting power signal, current signal, voltage signal, video signal, audio signal, or any communication signal generated in compliance with any communication protocol, between the first device 100 and the second device 300. In an embodiment of the invention, the signal transmission device 200 may be a cable, and the cable may be the cable implemented in compliance with any known specifications, such as, but not limited to, the High Definition Multimedia Interface (HDMI) specifications, the Universal Serial Bus (USB) specifications, etc., or may be the cable implemented in compliance with other special specifications (e.g., a dedicated product specification defined by a product manufacturer).

It is to be noted that FIG. 1 (as well as FIG. 4 described in the following paragraphs) is a simplified block diagram of the signal processing system, in which the signal transmission device 200 is represented by a line. However, the proposed signal transmission device 200 of the invention is not limited to the shape as shown in the figures. For example, the signal transmission device 200 may actually comprise one or more of the connectors or plugs used to connect the first device 100 and the second device 300, and a transmission line used to transmit signals.

Figure 2:
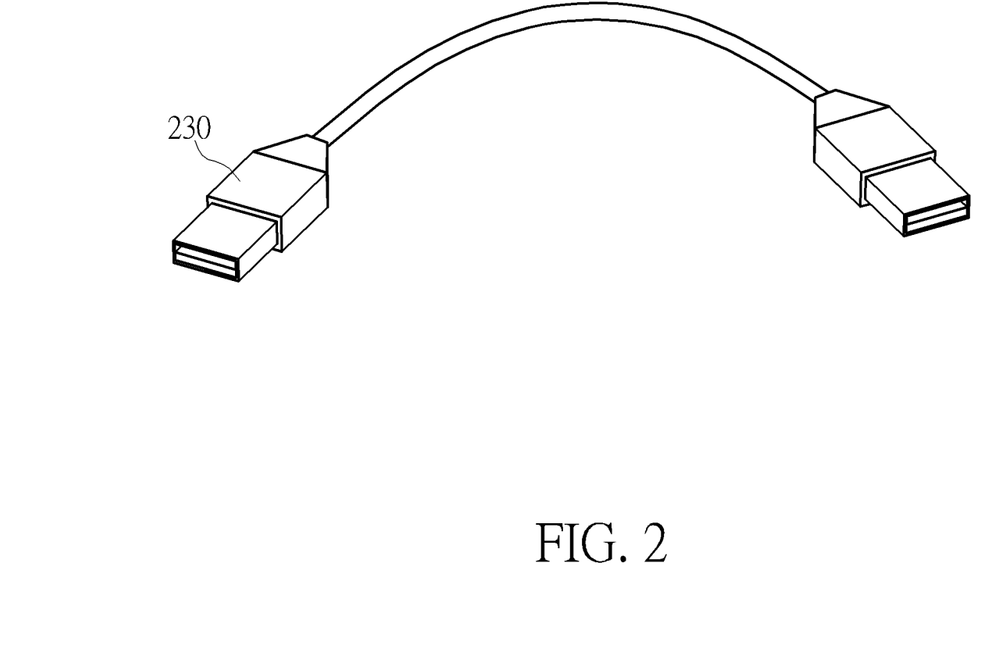
FIG. 2 is a schematic diagram showing a potential appearance of a signal transmission device according to an embodiment of the invention.

According to an embodiment of the invention, besides the components such as connectors or plugs and transmission lines for transmitting signals, the signal transmission device 200 may further comprise a memory device 210. FIG. 2 is a schematic diagram showing the appearance of a signal transmission device according to an embodiment of the invention. The memory device 210 may be configured in the signal transmission device 200 and disposed at the connector or plug end of the signal transmission device 200, such as the connector 230 shown in FIG. 2. It is to be noted that the invention is not limited to disposing the memory device 210 at the connector or plug end of the signal transmission device 200. The memory device 210 stores the attribute information Attribute_Info of the signal transmission device 200. The attribute information Attribute_Info records information regarding at least one attribute of the signal transmission device 200. The attribute information Attribute_Info may be written into the memory device 210 when the signal transmission device 200 is being manufactured.

In the embodiments of the invention, the attribute of the signal transmission device 200 may be, for example, but not limited to, parameters related to applicable current (e.g., the range of applicable current, the upper limit of applicable current, etc.), parameters related to applicable voltage (e.g., the range of applicable voltage, the upper limit applicable voltage, etc.), parameters related to applicable power (e.g., the range of applicable power, the upper limit of applicable power, etc.), rated current, rated voltage, rated power, and/or parameters related maximum tolerable current, voltage and power, or others.

According to an embodiment of the invention, at least one of the first device 100 and the second device 300 may read the attribute information Attribute_Info from the memory device 210, determine at least one attribute of the signal transmission device 200 according to the attribute information Attribute_Info, and set a maximum value or a minimum value, for example, the maximum current, of a signal output by the first device 100 or the second device 300 according to the determined at least one attribute.

Figure 3:
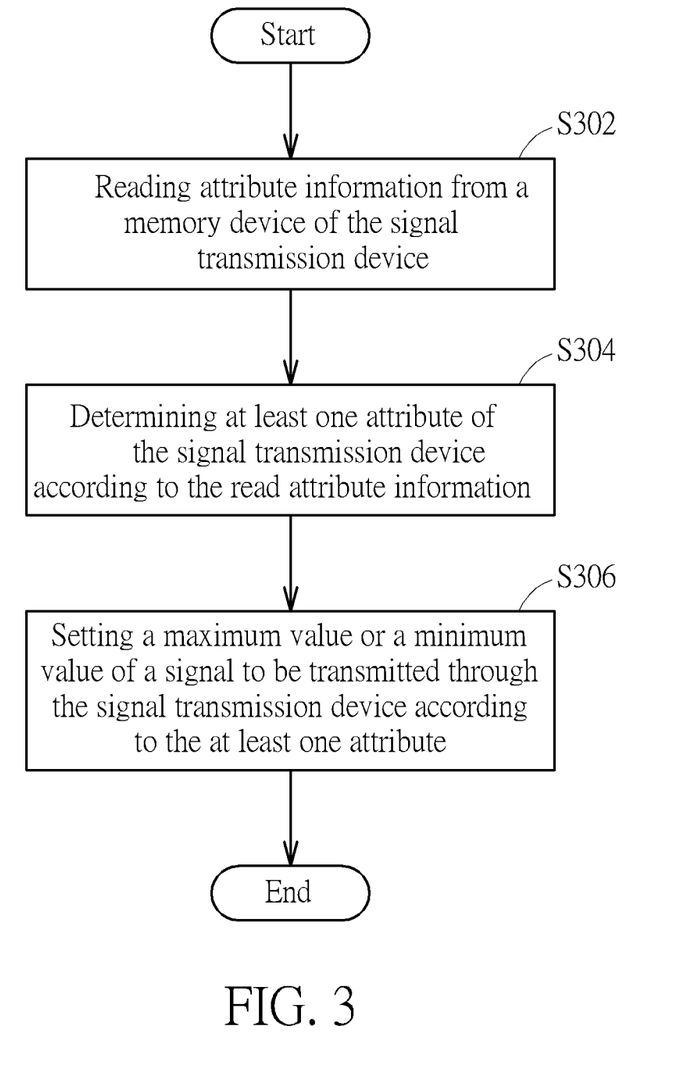
FIG. 3 shows an exemplary flow chart of a method for identifying a signal transmission device according to an embodiment of the invention.

FIG. 3 shows an exemplary flow chart of a method for identifying a signal transmission device according to an embodiment of the invention, wherein the exemplary flow further comprises at least one subsequent control operation after identifying the attribute of the signal transmission device. The method for identifying a signal transmission device may comprise the following steps:

Step S302: attribute information is read from a memory device of the signal transmission device. In the embodiments of the invention, step S302 may be performed by any device (generally, the first device 100 or the second device 300, but in the case where the signal transmission device 200 also comprises a processor capable of performing the corresponding operations is not excluded).

Step S304: the at least one attribute of the signal transmission device is determined according to the read attribute information.

Step S306: a maximum value or a minimum value of a signal to be transmitted through the signal transmission device 200 is set according to the at least one attribute, where the maximum value may be, for example, but not limited to, a value of the maximum power, the maximum current, or the maximum voltage, and the minimum value may be, for example, but not limited to, a value of the minimum power, the minimum current, or the minimum voltage.

In the embodiment of the invention, step S304 and step S306 may be performed by any device in the signal processing system, and steps S302, S304 and S306 are not limited to be performed by the same device.

In the following paragraphs, the internal components of the first device 100 and the second device 300 will be described in more detail with reference to FIG. 1 and FIG. 3 as examples.

Referring to FIG. 1, in this embodiment, the first device 100 may provide power for the second device 300. Therefore, in this embodiment, the first device 100 may comprise a power module 110 and a microprocessor 120. The power module 110 may comprise a power control device 111, a power monitoring device 112 and a power output device 113. The power control device 111 may be a power control chip arranged to control the output power of the first device 100. The power monitoring device 112 is arranged to monitor the output power of the first device 100. The power output device 113 is arranged to output power to the second device 300.

The microprocessor 120 may at least comprise an attribute identification device 121 and a communication device 122. The microprocessor 120 may communicate with the second device 300 via the communication device 122, and may read the memory device 210 of the signal transmission device 200 via the communication device 122 to obtain the attribute information Attribute_Info. The attribute identification device 121 is arranged to determine at least one attribute of the signal transmission device 200 according to the obtained attribute information Attribute_Info.

The second device 300 may comprise one or more functional blocks (as shown by dashed boxes in the FIG. 1) and a microprocessor 320. The functional blocks may comprise, for example, but not limited to, a panel device 331, a wired communication device 332, a wireless communication device 333, a speaker device 334, and so on. The panel device 331 is arranged to display video signals, for example, the video signal provided by the first device 100. The wired communication device 332 is arranged to provide functions of wired communication, for example, to enable the second device 300 to perform wired communication with an external device through an Ethernet network. The wireless communication device 333 is arranged to provide functions of wireless communication, for example, to enable the second device 300 to wirelessly communicate with an external device through Wi-Fi. The microprocessor 320 may at least comprise a communication device 322. The microprocessor 320 may communicate with the first device 100 via the communication device 322 to obtain required information.

It is to be noted that the attribute identification device 121 and the communication devices 122 and 322 may be implemented by software and/or firmware modules, respectively, or may be implemented by dedicated hardware. When the attribute identification device 121 and the communication devices 122 and 322 are implemented by software and/or firmware modules, the microprocessors 120 and 320 may perform the corresponding operations by executing the corresponding program codes, and when the microprocessors 120 and 320 perform the corresponding operations by executing the corresponding program codes, these software or firmware modules may be regarded as dedicated hardware, for example, may be regarded as sub-units of the microprocessor 120 or 320. In addition, those skilled in the art can understand that the first device 100 and the second device 300 may certainly comprise other elements not shown in FIG. 1 to implement the required functions.

According to an embodiment of the invention, when identifying the signal transmission device, the microprocessor 120 of the first device 100 may first read the memory device 210 of the signal transmission device 200 via the communication device 122 to obtain the attribute information Attribute_Info. The obtained attribute information Attribute_Info may be provided to the attribute identification device 121, for determining at least one attribute, for example, the range of applicable power, of the signal transmission device 200 based on the obtained attribute information Attribute_Info. Then, the microprocessor 120 may set the maximum output power of the power module 110 according to the range of applicable power of the signal transmission device 200, and notify the second device 300 of the obtained attribute information or this setting value via the communication device 122. For example, the first device 100 may send a notification message to the second device 300 via the communication device 122 to notify the second device 300 of the attribute of the signal transmission device 200, for example, the aforementioned range of applicable power, or the setting value set by first device 100 based on this attribute, for example, the aforementioned maximum output power.

According to an embodiment of the invention, after setting the maximum value or the minimum value, for example, the aforementioned maximum output power, of the signal to be transmitted through the signal transmission device 200, according to the obtained attribute of the signal transmission device 200, the first device 100 may follow this setting to control the signal to be transmitted through the signal transmission device 200. For example, the power monitoring device 112 may continuously monitor the power output by the power output device 113 and report the monitoring result to the power control device 111. When the power control device 111 determines that the output power is excessively high, the power control device 111 controls the power output device 113 to reduce the output power, or reduce the output voltage or current, so that the power of the signal transmitted through the signal transmission device 200 can be appropriately controlled within the range of applicable power of the signal transmission device 200.

It is to be noted that the reading of the attribute information Attribute_Info, the identification of the attribute of the signal transmission device 200, the supply of power, and the control of power supply/output power (or output voltage or current) are not limited to be implemented only in the first device 100. One or more of the aforementioned operations may also be implemented in the second device 300.

Figure 4:
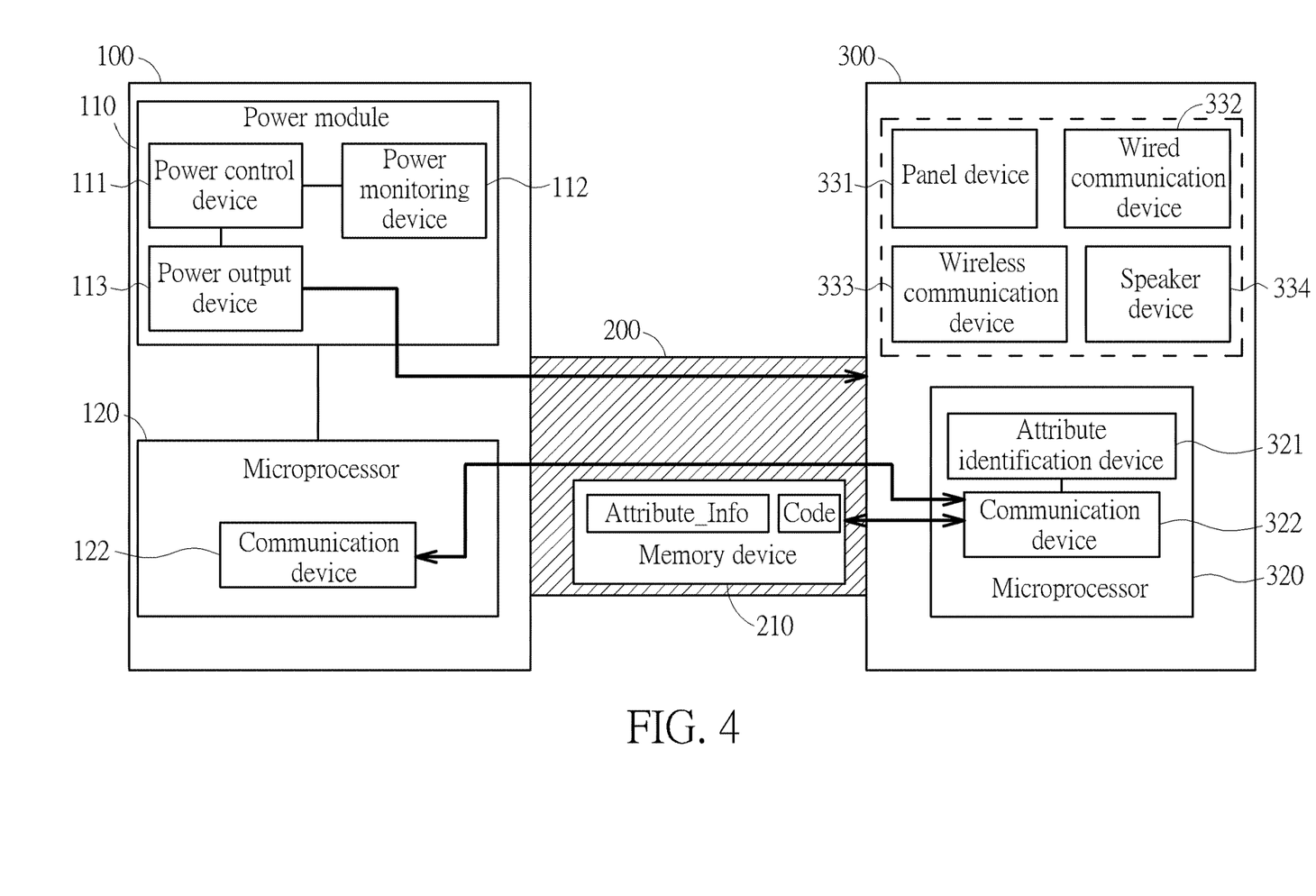
FIG. 4 shows a block diagram of a signal processing system according to another embodiment of the invention.

FIG. 4 shows a block diagram of a signal processing system according to another embodiment of the invention. The signal processing system shown in FIG. 4 is similar to the signal processing system shown in FIG. 1, except that the microprocessor 320 of the second device 300 further comprises an attribute identification device 321. When identifying the signal transmission device 200, the microprocessor 320 of the second device 300 may first read the memory device 210 of the signal transmission device 200 via the communication device 322 to obtain the attribute information Attribute_Info. The obtained attribute information Attribute_Info may be provided to the attribute identification device 321, for determining at least one attribute, for example, the range of applicable power, of the signal transmission device 200 based on the obtained attribute information Attribute_Info. Then, the microprocessor 320 may notify the first device 100 of the obtained attribute information via the communication device 322. For example, the second device 300 may send a notification message to the first device 100 via the communication device 322 to notify the first device 100 of the attribute of the signal transmission device 200, such as the aforementioned range of applicable power.

After the attribute of the signal transmission device 200 is retrieved, the microprocessor 120 of the first device 100 may perform relevant settings based on this information, for example, set the maximum output power of the power module 110, and may further inform the second device of the settings via the communication device 122. The subsequent operations may be similar or identical to the embodiment as illustrated in FIG. 1 after the relevant settings are completed, for example, the aforementioned maximum output power, of the signal to be transmitted through the signal transmission device 200 according to the obtained attribute of the signal transmission device 200.

It is to be noted that FIG. 1 and FIG. 4 only show some exemplary system architectures for implementing the invention, but the invention is not limited thereto. For example, in other embodiments of the invention, the supply of power, and the control of power supply/ output power (or output voltage or current) may also be implemented in the second device 300. In such embodiments, the second device 300 may comprise a power module for providing power to the first device 100 and controlling and monitoring the output power. For example, the second device 300 may set the maximum or minimum power (or current, voltage) of the output signal according to the attribute of the signal transmission device 200, and may further send a notification message to the first device 100 to notify the first device 100 of the maximum or minimum power (or current, voltage) of the signal set by the second device 300.

In addition, it is to be noted that FIG. 1 and FIG. 4 present simplified block diagrams of a signal processing system in which only the components relevant to the invention are shown. As will be readily appreciated by a person of ordinary skill in the art, a signal processing system may further comprise other components not shown in FIG. 1 and FIG. 4 and arranged for implementing the functions of required signal processing. In addition, it is to be noted that FIG. 1 and FIG. 4 are illustrated by way of example and the drawings are not necessarily drawn to scale.

According to an embodiment of the invention, the memory device 210 may further store information regarding an exclusive code (e.g. the "Code" in FIG. 1 and FIG. 4), which is a unique code of the signal transmission device 200. Different signal transmission devices 200 may have different exclusive codes. For example, when the signal transmission device 200 is a cable, each cable has its own exclusive code, that is, different cables have different exclusive codes. After the signal transmission device 200 is connected to the signal processing system and before the signal transmission starts, the first device 100 and/or the second device 300 may read the information regarding the exclusive code (e.g. the "Code") of the signal transmission device 200 from the memory device 210, and determine whether the signal transmission device 200 is a signal transmission device allowed to be used in the signal processing system according to the exclusive code. For example, the first device 100 and/or the second device 300 may obtain the manufacturer information of the signal transmission device 200, the product authorization information of the signal transmission device 200, and/or the product certification information of the signal transmission device 200 from the information regarding the exclusive code (e.g. the "Code"), and use the information to determine whether the signal transmission device 200 is a signal transmission device allowed to be used in the signal processing system. If determination result shows yes, the first device 100 and the second device 300 may start to transmit signals through the signal transmission device 200. If determination result shows no, the first device 100 and the second device 300 may determine not to transmit signals through the signal transmission device 200, so as to avoid the problem of damaging the devices in the signal transmission system due to inability to identify the attributes or specifications of the signal transmission device 200 (e.g., the signal transmission device cannot be identified, or the signal transmission device is an unauthorized or uncertified device), or due to the incompatible specifications of the signal transmission device. When only one of the first device 100 and the second device 300 determines that the signal transmission device 200 is a signal transmission device allowed to be used in the signal processing system based on the information regarding the exclusive code (e.g. the "Code") of the signal transmission device 200, it may also be notify the other one of the determination result.

In summary, via the proposed method for identifying a signal transmission device and the signal processing system implementing the proposed signal transmission device identification method, the operations of the signal processing system may be appropriately controlled according to the attribute information of the signal transmission device, and the problems of unexpected device overheat or damage due to the operation of erroneously connecting a signal transmission device that does not conform to its specifications or cannot be identified, or is unauthorized or uncertified to the signal processing system can be avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for identifying a signal transmission device, comprising:
   reading attribute information from a memory device by a first device of a signal processing system, wherein the attribute information records information regarding at least one attribute of the signal transmission device that is coupled between the first device and a second device of the signal processing system;
   determining the at least one attribute of the signal transmission device by the first device according to the attribute information; and
   setting a maximum value or a minimum value of a signal output by the first device or the second device according to the at least one attribute.

2. The method as claimed in claim 1, wherein the memory device is configured in the signal transmission device.

3. The method as claimed in claim 1, wherein the maximum value is a value of maximum power and the minimum value is a value of minimum power.

4. The method as claimed in claim 1, wherein the maximum value is a value of maximum current or a value of maximum voltage, and the minimum value is a value of minimum current or a value of minimum voltage.

5. The method as claimed in claim 1, further comprising:
   transmitting a notification message to the second device by the first device to notify the second device of the at least one attribute of the signal transmission device.

6. The method as claimed in claim 1, wherein when setting of the maximum value or the minimum value of the signal according to the at least one attribute is performed by the first device, the method further comprises:
   transmitting a notification message to the second device by the first device to notify the second device of the maximum value or the minimum value of the signal set by the first device.

7. The method as claimed in claim 1, further comprising:
   reading an exclusive code from the memory device by the first device; and
   determining whether the signal transmission device is a signal transmission device allowed to be used in the signal processing system according to the exclusive code by the first device,
   wherein the first device or the second device transmits the signal through the signal transmission device after the signal transmission device is determined as a signal transmission device allowed to be used in the signal processing system.

8. A signal processing system, comprising:
   a first device, arranged to output a signal;
   a second device, arranged to receive the signal; and
   a signal transmission device, coupled between the first device and the second device and arranged to transmit the signal, wherein the signal transmission device comprises a memory device, the memory device stores attribute information, the attribute information records information regarding at least one attribute of the signal transmission device, and
   one of the first device and the second device is arranged to read the attribute information from the memory device, determine the at least one attribute of the signal transmission device according to the attribute information and set a maximum value or a minimum value of the signal output by the first device or another signal output by the second device according to the at least one attribute.

9. The signal processing system as claimed in claim 8, wherein the maximum value is a value of maximum power and the minimum value is a value of minimum power.

10. The signal processing system as claimed in claim 8, wherein the maximum value is a value of maximum current or maximum voltage and the minimum value is a value of minimum current or minimum voltage.

11. The signal processing system as claimed in claim 8, wherein said one of the first device and the second device is further arranged to transmit a notification message to another of the first device and the second device to notify said another of the first device and the second device of the at least one attribute of the signal transmission device.

12. The signal processing system as claimed in claim 8, wherein when the first device sets the maximum value or the minimum value of the signal according to the at least one attribute, the first device is further arranged to transmit a notification message to the second device to notify the second device of the maximum value or the minimum value of the signal set by the first device.

13. The signal processing system as claimed in claim 8, wherein when the second device sets the maximum value or the minimum value of said another signal according to the at least one attribute, the second device is further arranged to transmit a notification message to the first device to notify the first device of the maximum value or the minimum value of said another signal set by the second device.

14. The signal processing system as claimed in claim 8, wherein the memory device further stores an exclusive code of the signal transmission device, the first device is further arranged to read the exclusive code from the memory device and determine whether the signal transmission device is a signal transmission device allowed to be used in the signal processing system according to the exclusive code, and wherein the first device transmits the signal through the signal transmission device after the signal transmission device is determined as a signal transmission device allowed to be used in the signal processing system.

15. The signal processing system as claimed in claim 8, wherein the memory device further stores an exclusive code of the signal transmission device, the second device is further arranged to read the exclusive code from the memory device and determine whether the signal transmission device is a signal transmission device allowed to be used in the signal processing system according to the exclusive code, and wherein the second device transmits said another signal through the signal transmission device after the signal transmission device is determined as a signal transmission device allowed to be used in the signal processing system.

\* \* \* \* \*